(12) United States Patent
Berzins

(10) Patent No.: US 11,092,649 B2
(45) Date of Patent: Aug. 17, 2021

(54) METHOD FOR REDUCING POWER CONSUMPTION IN SCANNABLE FLIP-FLOPS WITHOUT ADDITIONAL CIRCUITRY

(71) Applicant: Samsung Electronics Co., Ltd., Suwon-si (KR)

(72) Inventor: Matthew Berzins, Cedar Park, TX (US)

(73) Assignee: SAMSUNG ELECTRONICS CO., LTD.

( * ) Notice: Subject to any disclaimer, the term of this patent is extended or adjusted under 35 U.S.C. 154(b) by 8 days.

(21) Appl. No.: 16/523,993

(22) Filed: Jul. 26, 2019

(65) Prior Publication Data

US 2020/0292617 A1 Sep. 17, 2020

Related U.S. Application Data

(60) Provisional application No. 62/817,547, filed on Mar. 12, 2019.

(51) Int. Cl.
*G01R 31/28* (2006.01)
*G01R 31/3185* (2006.01)
*G01R 31/317* (2006.01)

(52) U.S. Cl.
CPC ........ *G01R 31/318575* (2013.01); *G01R 31/31721* (2013.01); *G01R 31/31727* (2013.01); *G01R 31/318536* (2013.01); *G01R 31/318552* (2013.01)

(58) Field of Classification Search
CPC ........ G01R 31/31721; G01R 31/31727; G01R 31/318536; G01R 31/318552; G01R 31/318575; G06F 1/32; G09G 3/36; G11C 5/14; H03K 19/003
See application file for complete search history.

(56) References Cited

U.S. PATENT DOCUMENTS

| | | | |
|---|---|---|---|
| 5,252,917 A * | 10/1993 | Kadowaki | G01R 31/318552 326/16 |
| 5,973,552 A * | 10/1999 | Allan | H03K 19/0016 327/541 |
| 9,473,121 B1 * | 10/2016 | Abhishek | G01R 31/318541 |
| 10,026,498 B1 * | 7/2018 | Agrawal | G11C 29/023 |
| 10,126,363 B2 | 11/2018 | Lin et al. | |
| 2003/0110432 A1 | 6/2003 | Hill et al. | |
| 2005/0229059 A1 | 10/2005 | Hirano | |
| 2006/0085709 A1 * | 4/2006 | Kim | G01R 31/318541 714/726 |

(Continued)

*Primary Examiner* — Albert Decady
*Assistant Examiner* — Enamul M Kabir
(74) *Attorney, Agent, or Firm* — Renaissance IP Law Group LLP

(57) ABSTRACT

According to one general aspect, an apparatus may include a first power signal having a high voltage. The apparatus may include a second power signal having a low voltage. The apparatus may include a third power signal having a voltage configured to switch between the high voltage and the low voltage. The apparatus may include a latching circuit powered by the first power signal and the second power signal. The apparatus may include a selection circuit configured to select between, at least, a first data signal and a second data signal, and powered by the first power signal, the second power signal, and the third power signal.

20 Claims, 7 Drawing Sheets

(56) References Cited

U.S. PATENT DOCUMENTS

| | | | |
|---|---|---|---|
| 2006/0259838 A1* | 11/2006 | Nardini | G01R 31/318575 714/726 |
| 2009/0089599 A1* | 4/2009 | Westwick | G06F 1/3203 713/323 |
| 2009/0300448 A1* | 12/2009 | Tomita | G01R 31/318541 714/731 |
| 2010/0162058 A1* | 6/2010 | Brown | G01R 31/318536 714/726 |
| 2010/0275076 A1* | 10/2010 | Maehara | G01R 31/318544 714/726 |
| 2012/0286850 A1* | 11/2012 | Myers | G11C 14/0054 327/530 |
| 2013/0057329 A1 | 3/2013 | Tiwari et al. | |
| 2013/0154709 A1 | 6/2013 | Huang | |
| 2013/0241617 A1 | 9/2013 | Kim | |
| 2014/0078815 A1* | 3/2014 | Hollis | G11C 29/1201 365/149 |
| 2014/0328115 A1* | 11/2014 | Bartling | H03K 3/35625 365/156 |
| 2016/0308372 A1* | 10/2016 | Kolla | G11C 5/14 |
| 2018/0143247 A1* | 5/2018 | Lundberg | G01R 31/31724 |
| 2018/0190343 A1* | 7/2018 | Menezes | G11C 11/417 |
| 2018/0342287 A1* | 11/2018 | Berzins | H03K 3/0372 |
| 2018/0375500 A1* | 12/2018 | Hsieh | H03K 3/35625 |
| 2019/0011500 A1* | 1/2019 | Shah | G01R 31/318558 |

* cited by examiner

METHOD FOR REDUCING POWER CONSUMPTION IN SCANNABLE FLIP-FLOPS WITHOUT ADDITIONAL CIRCUITRY

CROSS-REFERENCE TO RELATED APPLICATION

This application claims priority under 35 U.S.C. § 119 to Provisional Patent Application Ser. No. 62/817,547, entitled "A NOVEL METHOD FOR REDUCING POWER CONSUMPTION IN SCANNABLE FLIP-FLOPS WITHOUT ADDITIONAL CIRCUITRY" filed on Mar. 12, 2019. The subject matter of this earlier filed application is hereby incorporated by reference.

TECHNICAL FIELD

This description relates to power management, and more specifically to a method for reducing power consumption in scannable flip-flops without additional circuitry.

BACKGROUND

A scan chain is a technique used in design for testing (DFT). The objective is to make testing easier by providing a simple way to set and observe every flip-flop in an integrated circuit (IC). Often a series of flip-slops are strung together to form a chain (e.g., a daisy chain). Data (Scan_in) is pushed into one end of the chain and data (Scan_out) pops out the other end of the chain. This allows an engineer the ability to see what values the flip-flops, deep in the chip, stored while the circuit was running.

In general, when the IC operates normally, the flip-flops in the chain perform their normal logical tasks and store values as dictated by the logic circuits that they are part of. Then, the circuit may be stopped (often mid-computation). Instead of the flip-flops being coupled to the next logical circuit, they are re-configured to be part of the scan chain. Test data is input into the head of the scan chain (e.g., scan_in signal), and the last values stored the flip-flops is pushed out the tail of the scan chain (e.g., scan_out signal). This allows a test engineer to both set internal values to a desired state, and see internal values that would not normally be visible.

The most famous of scan chain standards is the Institute of Electrical and Electronics Engineers (IEEE) 1149.1-1990 (including other years or revisions) or the Joint Test Action Group (JTAG) standard. However, various other scan chain standards or scheme are employed. For example, while the JTAG standard employs its own clock, some scan chains operate on the core or IC's main clock. It is understood that the above are merely a few illustrative examples to which the disclosed subject matter is not limited.

SUMMARY

According to one general aspect, an apparatus may include a first power signal having a high voltage. The apparatus may include a second power signal having a low voltage. The apparatus may include a third power signal having a voltage configured to switch between the high voltage and the low voltage. The apparatus may include a latching circuit powered by the first power signal and the second power signal. The apparatus may include a selection circuit configured to select between, at least, a first data signal and a second data signal, and powered by the first power signal, the second power signal, and the third power signal.

According to another general aspect, an apparatus may include a first stage of the apparatus, wherein the first stage is powered by a first power signal and a second power signal, and receives a first data signal as input, and outputs a selected data signal. The apparatus may include a second stage of the apparatus, wherein the second stage is powered by a third power signal, and either the first power signal or the second power signal, and receives a second data signal as input, and is coupled with the first stage. The apparatus may be configured to output either the first data signal or the second data signal as the selected data signal.

According to another general aspect, a scan chain flip-flop may include a selection circuit configured to select between a data signal and a scan-in signal, based upon a scan enable signal, and output a selected data signal. The scan chain flip-flop may include a flip-flop circuit configured to latch the selected data signal. The selection circuit may be configured to be, at least partially, coupled with the scan enable signal as a power rail.

The details of one or more implementations are set forth in the accompanying drawings and the description below. Other features will be apparent from the description and drawings, and from the claims.

A system and/or method for power management, and more specifically to a method for reducing power consumption in scannable flip-flops without additional circuitry, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1A:
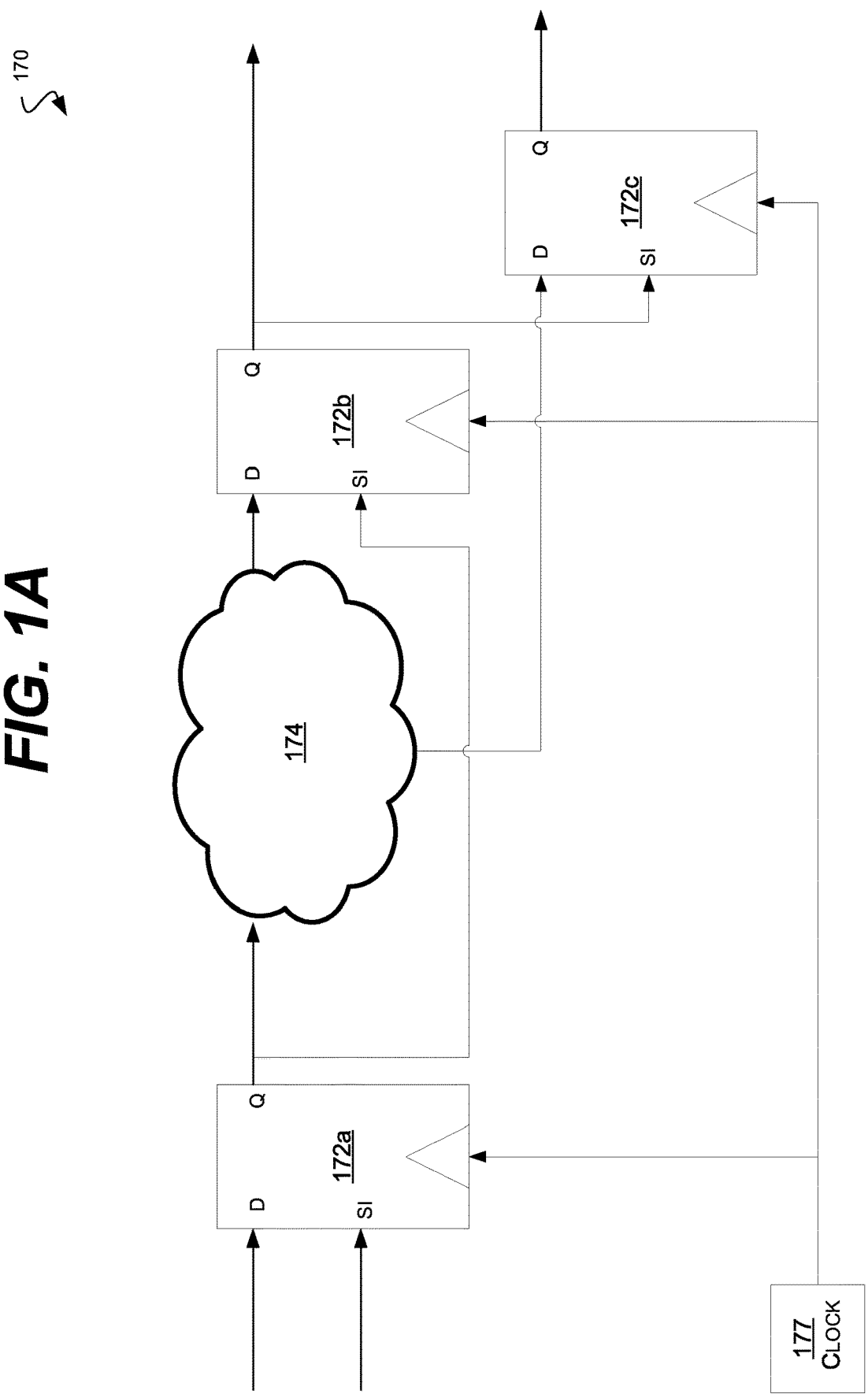
FIGS. 1A, 1B and 1C are block diagrams of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Likewise, electrical terms, such as "high" "low", "pull up", "pull down", "1", "0" and the like, may be used herein for ease of description to describe a voltage level or current relative to other voltage levels or to another element(s) or feature(s) as illustrated in the figures. It will be understood that the electrical relative terms are intended to encompass different reference voltages of the device in use or operation in addition to the voltages or currents depicted in the figures. For example, if the device or signals in the figures are inverted or use other reference voltages, currents, or charges, elements described as "high" or "pulled up" would then be "low" or "pulled down" compared to the new reference voltage or current. Thus, the exemplary term "high" may encompass both a relatively low or high voltage or current. The device may be otherwise based upon different electrical frames of reference and the electrical relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1A is a block diagram of an example embodiment of a system 170 in accordance with the disclosed subject matter. In the illustrated embodiment, the system 200 may include a detailed view of a section of a larger scan chain.

In the illustrated embodiment, the system 170 may include a number of flip-flops (e.g., flipflops 172a, 172b, and 172c). The flip-flops 172 may be controlled or synchronized by a clock signal 177. The system 170 may also include a plurality of logic circuits 174. In the illustrated embodiment, the flip-flops 172a and 172c may store the inputs and outputs, respectively, of logic circuits 174.

Each flip-flop may include a D input port for, during normal operation, writing new data into the flip-flop, and a Q output port for reading the stored data from the flip-flop. Furthermore, each flip-flop may include a scan-in (SI) input port that, when in scan chain mode, writes new data into the flip-flop. It is understood that the above is merely one illustrative example to which the disclosed subject matter is not limited.

During normal operation, data is transmitted from the Q port of a first flip-flop (e.g., flip-flop 172a), through the logic circuits 174, and to the D input ports of a second and third flip-flops (e.g., flip-flops 172b and 172c). In such an embodiment, it takes time to go through the logic circuits 174. Generally, this time period is sufficient to meet any hold timing requirements of the flip-flops.

Conversely, when the system 170 is in scan mode, the logic circuits 174 may be bypassed, as the data is shifted along the scan chain. In such an embodiment, the data is transmitted from the Q port of a first flip-flop (e.g., flip-flop 172a), directly to the SI input port of a second flip-flop (e.g., flip-flop 172b), and then to the SI input port of the next flip-flop in the scan chain (e.g., flip-flop 172c). Because there are no (or very few) circuits between the flip-flops, in scan mode, the delay between the two flip-flops is often very small. In various embodiments, the delay may be small enough to violate the hold time requirements of the flip-flops. This may cause data corruption.

Often, the solution is to insert delay circuits (not shown) into the system. Such delay circuits cost power and area within the circuit. Occasionally these delay circuits are integrated into the flip-flops themselves. For example, a series of inverters may be added before the input portion of the SI port. When a common or uniform design scheme is used through out the chip, these extra delay circuits are often added to every flip-flop regardless of whether they are needed for that particular flip-flop or not.

Figure 1B:
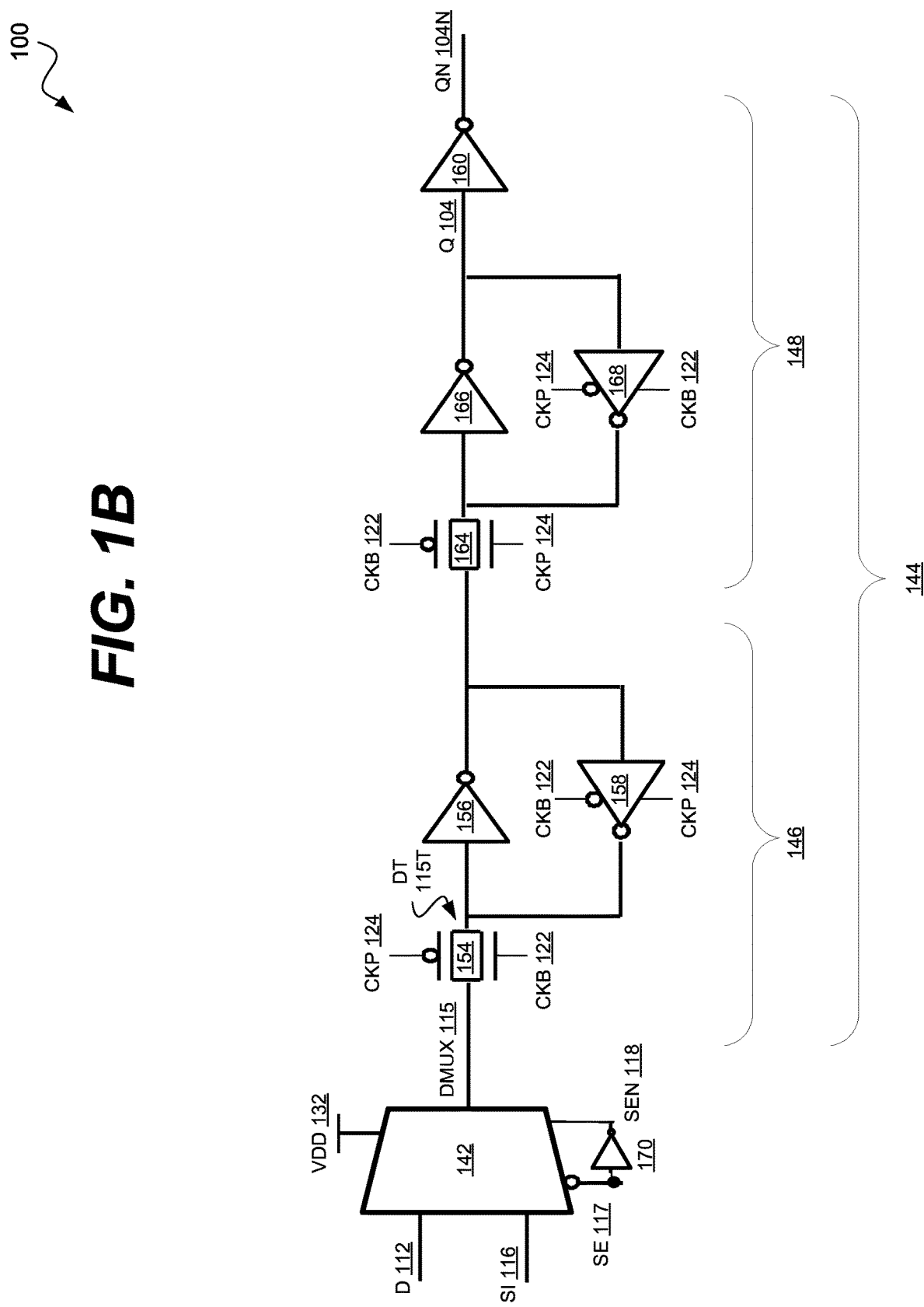
Figure 1C:
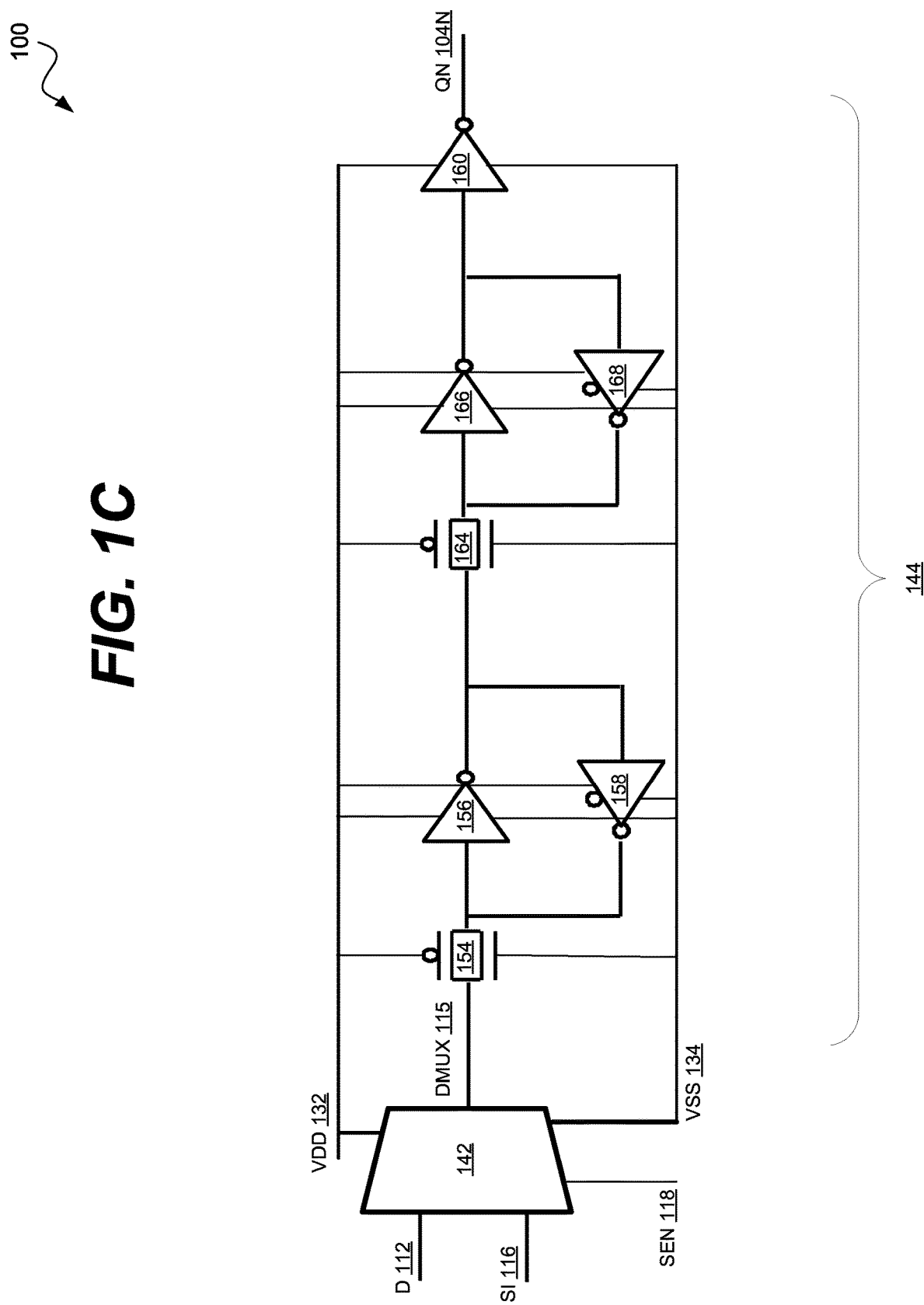

FIGS. 1B and 1C are block diagrams of an example embodiment of a system 100 in accordance with the disclosed subject matter. In various embodiments, the system 100 may include a flip-flop with integrated scan functionality or scannable flip-flop. In various embodiments, the system 100 may be included in an integrated circuit (IC), such as a processor, central processor unit (CPU), graphics processor unit (GPU), system-on-a chip (SOC), etc. It is understood that the above are merely a few illustrative examples to which the disclosed subject matter is not limited.

In such an embodiment, the circuit 100 may include a selection circuit or multiplexer (MUX) 142, a memory element circuit 144. In the illustrated embodiment, the memory element may include a master portion 146 and a slave portion 148. It is understood that the above is merely one illustrative example to which the disclosed subject matter is not limited.

Figure 4:
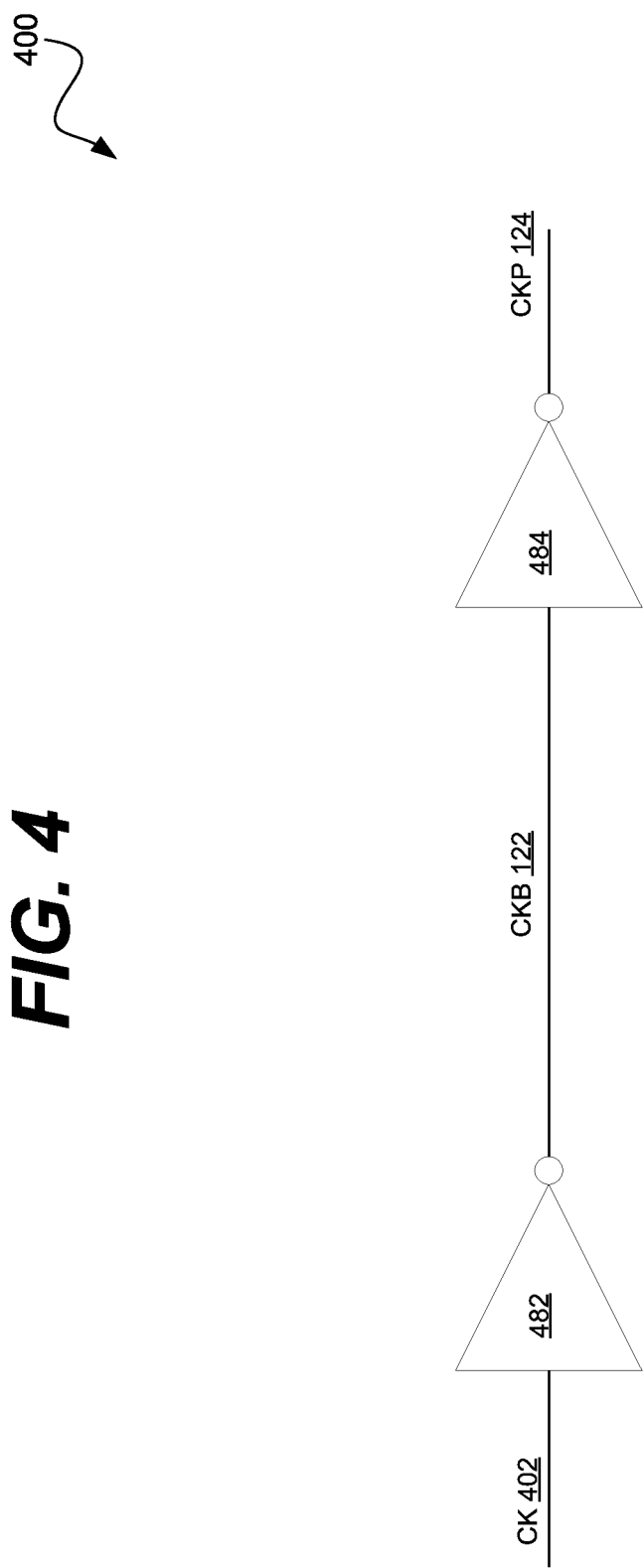
FIG. 4 is a circuit diagram of an example embodiment of a system in accordance with the disclosed subject matter.

FIG. 4 is a block diagram of an example embodiment of a circuit 400 in accordance with the disclosed subject matter. As described above, the circuit 400 may be controlled by a clock signal 402. Circuit 400 shows how the clock signal 402 may be processed for internal use by the circuit 100.

In the illustrated embodiment, the clock signal 402 may generate two derivative clock signals CKB 122 and CKP 124. In such an embodiment, the circuit 400 may include two inverters 482 and 484 connected in series. This may be done, in part, to clean the clock signal 402 (e.g., restore the voltage to a common voltage level).

In such an embodiment, the earlier clock signal CKB 122 may be generated by the inverter 482 and may be the inverse of the earliest clock signal 402. The later clock signal CKP 124 may be generated by the inverter 484. The clock signals 122 and 124 are delayed (and in the case of clock 122, inverted) versions of the clock signal 402.

Returning to FIG. 1B, the clock signals CKB 122 and CKP 124 may be employed to control particular parts of the circuit 300.

In the illustrated embodiment, the selection circuit 142 may select between the normal operational input D 112 and the scan chain input SI 116. This may be done based on the scan enable signal SE 117. The selection circuit 142 may generate a selected input signal DMux 115.

The selected input signal DMux 115 may be presented to the master portion 146. The master portion 146 may include a pass or transmission gate 154 (producing DT 115T), and two feedback inverters 156 and 158. If the selected input signal DMux 115 changes before the later clock signal CKP 124 stabilizes to a high value (closing the pass-gate 154), a hold failure occurs, and the master portion 146 stores a wrong value.

The slave portion 148 may include a pass-gate 164, and two feedback inverters 166 and 168. Once the pass-gate 164 opens, the output signal from the master portion 124 is stored in the feedback inverters 166 and 168, and the signal Q 104 is output.

In the illustrated embodiment, the output of the slave portion 148 may be passed through an inverter 160. The inverter 160 may output the QN output signal 104. In some embodiments, only multiple inverters may be employed. It is understood that the above are merely a few illustrative examples to which the disclosed subject matter is not limited.

In the illustrated embodiment and in most block diagrams of systems, the power signals are omitted for clarification. Normally there are two power signals or rails, a high voltage rail (Vdd) and a low voltage rail (Vss or ground). In the illustrated embodiment, the power rails are shown for the MUX 142.

In the illustrated embodiment, the MUX 142 may be powered by the high voltage rail Vdd 132, as is normal. And, the MUX 142 may also be powered, at least in part, not by the normal low voltage rail Vss (not shown in FIG. 1B), but by the Scan Enable signal 117 (or more accurately the inverse of the Scan Enable signal SEN 118, via inverter 170).

In such an embodiment, the use of SEN 118 as the low voltage rail or ground to the MUX 142 may allow the scan in signal 116 to be delayed so that the hold time for the flip-flop 144 is lowered (compared to using Vss as ground). In such an embodiment, the scan in signal 116 may be less susceptible to hold failure, as described above.

In various embodiments, when the scan test mode is not enabled, the scan circuitry of the MUX 142 may not switch or may be effectively or substantially powered off. In such an embodiment, the use of SEN 118 as a ground signal may create a pseudo-AND gate without the use of additional circuitry (e.g., an actual additional AND gate). Further, by turning off the scan circuitry of the MUX 142 leakage current mat be reduced.

FIG. 1C is block diagrams of an example embodiment of a system 100 in accordance with the disclosed subject matter. FIG. 1C highlights an aspect of system 100 that is normally removed from the diagrams, specifically the voltage power rails.

In the illustrated embodiment, the control, input, and output signals and/or their labels have mostly been removed. Instead the power rails have been explicitly drawn. In the illustrated embodiment, the system 100 may be powered by three power signals: the high voltage signal Vdd 132, the low voltage or ground signal Vss 134, and the third power signal SEN 118.

As is typical, the flip-flop 144 may be powered by the power rails Vdd 132 and Vss 134. In various embodiments, the flip-flop 144 may make use of complementary metal-oxide-semiconductor (CMOS) technology, which uses two power sources (a high voltage and low voltage or ground).

In the illustrated embodiment, the selection circuit or MUX 142 may make use of three voltage sources or rails. In the illustrated embodiment, the high voltage signal Vdd 132 may act as a high voltage rail for the entire circuitry of the MUX 142. A portion of the MUX 142 may employ the low voltage signal Vss 134 as a ground or low power rail. And, a second or another portion of the MUX 142 may employ the scan enable signal SEN 118 as a ground or low power rail.

In various embodiments, the power signals Vdd 132 and Vss 134 may have a relatively constant voltage, either high or low, and may be essentially at a steady state during the operation of the system 100 (excluding events, such as, for example, power on and off). Conversely, the power signal scan enable 118 may switch from high to low (and vice versa) during the operation of the system 100. In various embodiments, the SEN 118 signal may be produced by another circuit (not shown) that uses Vdd 132 and Vss 134 as power rails, and therefore may switch between the two voltages provided by them. However, in various embodiments, having a third voltage state (different from Vdd 132 and Vss 134) may be advantageous in some embodiments.

As described above, as the system 100 is taken in and out of scan mode the SEN 118 signal may switch between the high voltage and the low voltage levels. In such an embodiment, when the SEN 118 signal is substantially the same voltage as the high voltage rail Vdd 132, the CMOS circuitry may turn off or be powered down (as the voltage differential needed to drive CMOS circuitry is no longer present). Whereas, when the SEN 118 is low or the same level as Vss 134, the CMOS circuitry may turn on and operate normally.

Figure 2:
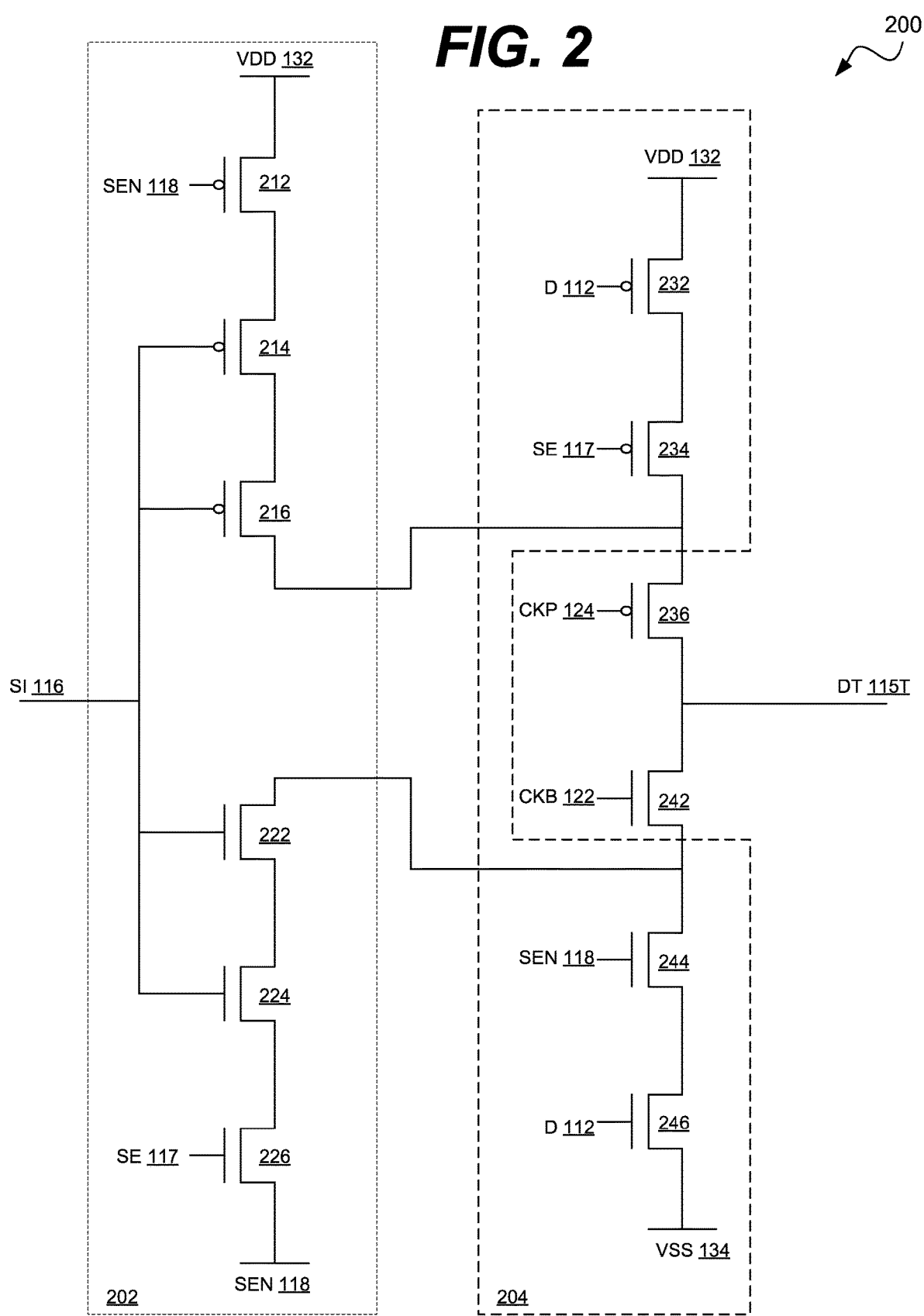
FIG. 2 is a circuit diagram of an example embodiment of a system in accordance with the disclosed subject matter.

FIG. 2 is a circuit diagram of an example embodiment of a circuit 200 in accordance with the disclosed subject matter. In various embodiments, the circuit 200 may include the selection circuit and master portion's pass-gate of FIG. 1B.

In the illustrated embodiment, the circuit 200 may include the P-type metal-oxide-semiconductor (PMOS) transistors 212, 214, 216, 232, 234, and 236. The circuit 200 may include the N-type metal-oxide-semiconductor (NMOS) transistors 222, 224, 226, 242, 244, and 246. The circuit 200 may include a second stage or dynamic signal portion 202 in which a relatively low voltage is provided by the (inverse of the) scan enable signal SEN 118, and a first stage or static signal portion 204 in which a relatively low voltage is provided by a common ground Vss 134.

The transistors 212, 214, and 216 may be coupled in series and may be part of the dynamic signal portion 202. The transistors 212, 214, and 216 may be coupled between a high voltage Vdd 132 and the transistor 236 of the first stage 204. Transistors 214 and 216 may take the scan in signal SI 116 as input (e.g., the gate terminal). Whereas the transistor 212 may use the inverse of the scan enable signal SEN 118 as input.

The transistors 222, 224, and 226 may be coupled in series and may be part of the dynamic signal portion 202. The transistors 222, 224, and 226 may be coupled between the transistor 242 and the low voltage rail, which in this case is the inverse of the scan enable signal SEN 118. Transistors 222 and 224 may take the signal SI 116 as input. The transistor 226 may use the un-inverted scan enable signal SE 117 as input.

In the illustrated embodiment, the low voltage or ground for the transistors 222, 224, and 226 may be inverse of the scan enable signal SEN 118. As a changing or switching signal, the power is said to be dynamic.

The transistors 232, 234, and 236 may be coupled in series. The transistors 232, 234, and 236 may be coupled between the high voltage Vdd 132 and the transistor 242. As an unchanging core power signal, the power or high voltage is said to be static. The transistors 232 and 234 may be part of the static signal portion 204. Transistor 232 may take the data signal D 112 as input. Transistor 234 may take the scan enable signal SE 117 as input.

The transistors 242, 244, and 246 may be coupled in series. The transistors 242, 244, and 246 may be coupled between the low voltage Vss 134 and the transistor 242. The transistors 244 and 246 may be part of the static signal portion 204. Transistor 246 may take the signal D 112 as input. Transistor 244 may take the inverted scan enable signal SEN 118 as input.

In the illustrated embodiment, the transistors 236 and 242 may be the pass-gate of the master portion of the memory element circuit, as described above. In the illustrated embodiment, the transistor 236 may receive the later clock signal CKP 124 as input. The transistor 242 may receive the earlier clock signal CKB 122 as input. The transistors 236 and 242 may output the signal DT 115T.

In the illustrated embodiment, when the inverted scan enable signal 118 is low or substantially the same voltage as Vss 134, the portion of the dynamic stage 202 that is coupled with the inverted scan enable signal 118 (transistors 222, 224, and 226) may effectively turn on. The transistors 226 and 244 (with inputs SE 117 & SEN 118) may select the scan in signal SI 116, over the data signal D 112.

Conversely, in the illustrated embodiment, the portion of the dynamic stage 202 that is coupled with the inverted scan enable signal 118 (transistors 222, 224, and 226) may effectively power down when the inverted scan enable signal 118 is high (i.e., the same voltage as Vdd 132). This is because, MOS transistors require a certain voltage differential between their source and drain terminals to effectively operate, and without that voltage differential between the drain and source terminals, they are essentially turned off. This may produce a weak drive to the static stage 204, which is ignored or a "don't care" as the data signal D 112 is selected and allowed to pass through.

In such an embodiment, by turning off part of the AND gate-like portion of the circuit 200, the dynamic portion 202 does not switch, saving power. Likewise, leakage current from Vdd 132 to ground (normally Vss 134) is greatly reduced, as often the Vdd 132 and the ground (now SEN 118) are often the same voltage. In various embodiments, this may save 15% in leakage current and 1% in overall power savings.

By not adding delay circuits or buffers, the disclosed subject matter allows the disclosed flip-flop to operate with a data path speed and amount of clock power consumption that are similar to the conventional master/slave (MS) flip-flop. The disclosed subject matter has a smaller area and lower power requirement that traditional delay circuits. It is understood that the above are merely a few illustrative examples to which the disclosed subject matter is not limited.

Figure 3:
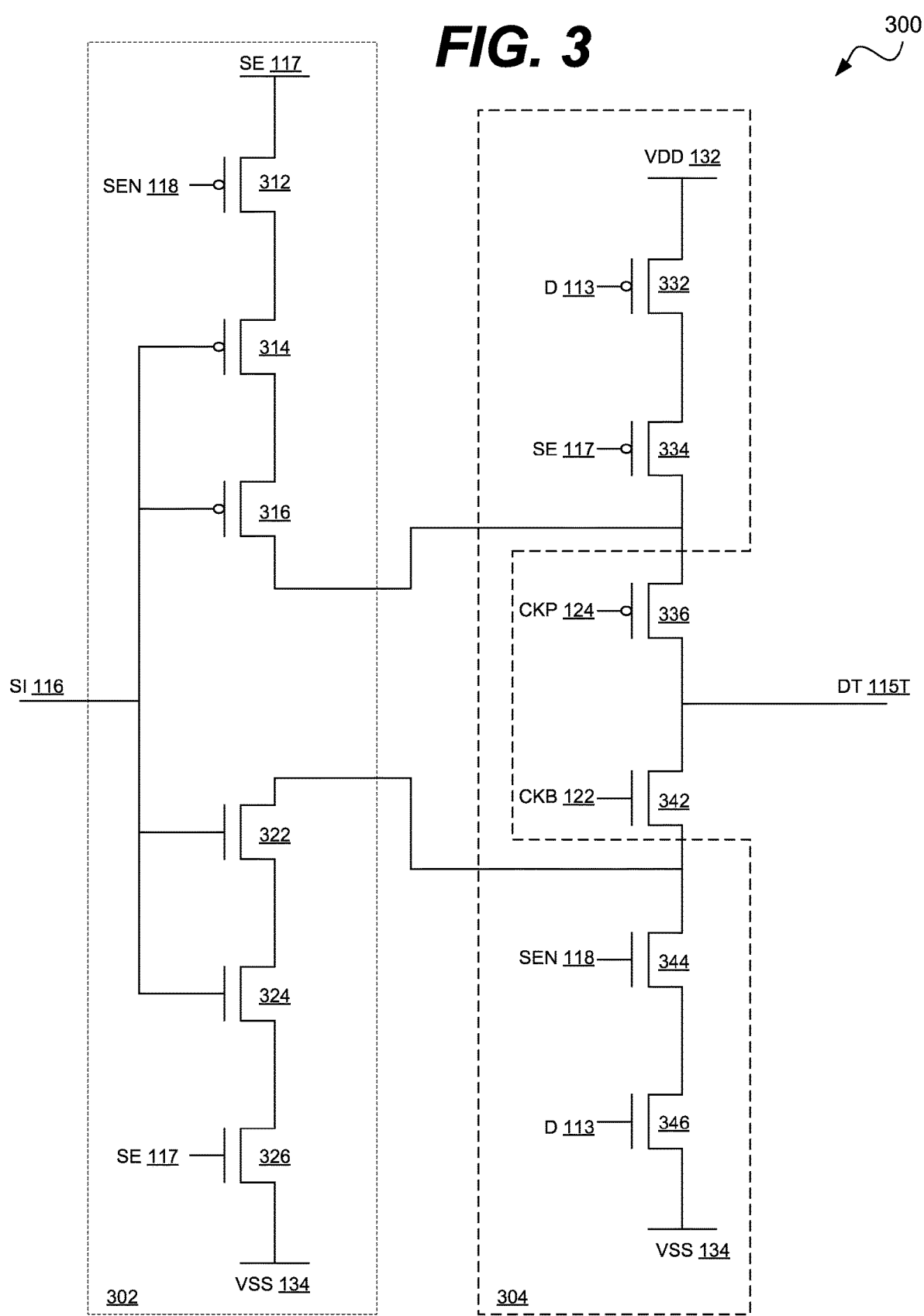
FIG. 3 is a circuit diagram of an example embodiment of a system in accordance with the disclosed subject matter.

FIG. 3 is a circuit diagram of an example embodiment of a circuit 300 in accordance with the disclosed subject matter. In various embodiments, the circuit 300 may include the selection circuit and master portion's pass-gate of FIG. 1B.

In the illustrated embodiment, the circuit 300 may include the P-type metal-oxide-semiconductor (PMOS) transistors 312, 314, 316, 332, 334, and 336. The circuit 300 may include the N-type metal-oxide-semiconductor (NMOS) transistors 322, 324, 326, 342, 344, and 346. The circuit 300 may include a second stage or dynamic signal portion 302 in which a relatively high voltage is provided by the scan enable signal SE 117, and a first stage or static signal portion 304 in which a relatively high voltage is provided by a power rail Vdd 132.

The transistors 312, 314, and 316 may be coupled in series and may be part of the dynamic signal portion 302. The transistors 312, 314, and 316 may be coupled between the switching signal SE 117 (acting as a high voltage signal) and the transistor 336 of the first stage 304. Transistors 314 and 316 may take the scan in signal SI 116 as input (e.g., the gate terminal). Whereas the transistor 312 may use the inverse of the scan enable signal SEN 118 as input.

The transistors 322, 324, and 326 may be coupled in series and may be part of the dynamic signal portion 302. The transistors 322, 324, and 326 may be coupled between the transistor 342 and the low voltage rail, which in this case is the static signal and common ground Vss 134. Transistors 322 and 324 may take the signal SI 116 as input. The transistor 326 may use the un-inverted scan enable signal SE 117 as input.

The transistors 332, 334, and 336 may be coupled in series. The transistors 332, 334, and 336 may be coupled between the high voltage Vdd 132 and the transistor 342. As an unchanging core power signal, the power or high voltage is said to be static. The transistors 332 and 334 may be part of the static signal portion 304. Transistor 332 may take the data signal D 112 as input. Transistor 334 may take the scan enable signal SE 117 as input.

The transistors 342, 344, and 346 may be coupled in series. The transistors 342, 344, and 346 may be coupled between the low voltage Vss 134 and the transistor 342. The transistors 344 and 346 may be part of the static signal portion 304. Transistor 346 may take the signal D 112 as input. Transistor 344 may take the inverted scan enable signal SEN 118 as input.

In the illustrated embodiment, the transistors 336 and 342 may be the pass-gate of the master portion of the memory element circuit, as described above. In the illustrated embodiment, the transistor 336 may receive the later clock signal CKP 124 as input. The transistor 342 may receive the earlier clock signal CKB 122 as input. The transistors 336 and 342 may output the signal DT 115T.

In the illustrated embodiment, when the scan enable signal 117 is high or substantially the same voltage as Vdd 132, the portion of the dynamic stage 302 that is coupled with the scan enable signal 117 (transistors 312, 314, and 316) may effectively turn on. The transistors 316 and 334 (with inputs SEN 118 & SE 117) may select the scan in signal SI 116, over the data signal D 112.

Conversely, in the illustrated embodiment, the portion of the dynamic stage 302 that is coupled with the scan enable signal 117 (transistors 312, 314, and 316) may effectively power down when the inverted scan enable signal 118 is low (i.e., the same voltage as Vss 134). This is because, MOS transistors require a certain voltage differential between their source and drain terminals to effectively operate, and without that voltage differential between the drain and source terminals, they are essentially turned off. This may produce a weak drive to the static stage 304, which is ignored or a "don't care" as the data signal D 112 is selected and allowed to pass through.

In such an embodiment, by turning off part of the AND gate-like portion of the circuit 300, the dynamic portion 302 does not switch, saving power. Likewise, leakage current from the high voltage rail (normally Vdd 132) to ground is greatly reduced. In various embodiments, this may save 15% in leakage current and 1% in overall power savings.

Figure 5:
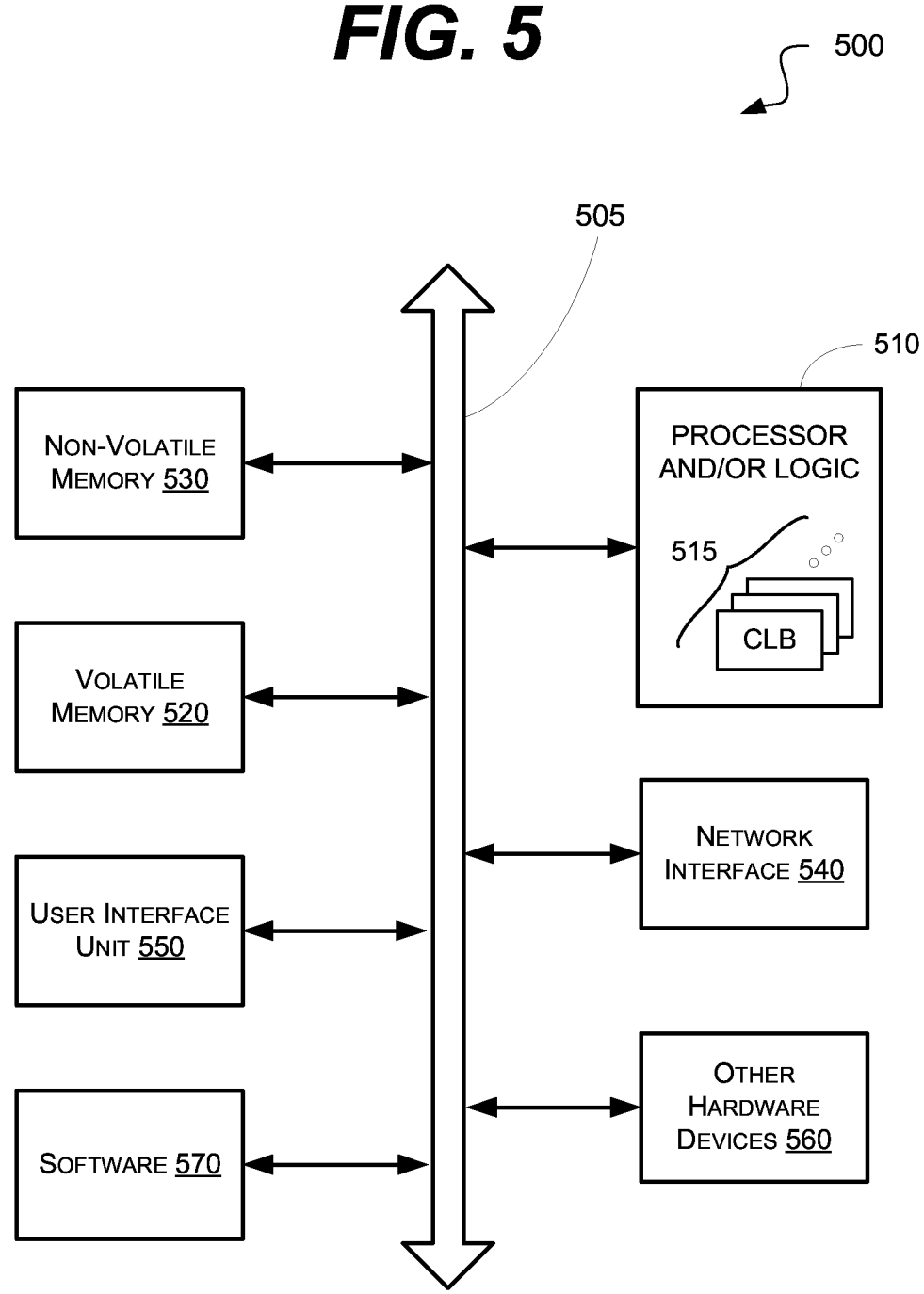
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM)). The information processing system 500 according to the disclosed subject matter may further include a non-volatile memory 530 (e.g., a hard drive, an optical memory, a NAND or Flash memory). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 500 according to the disclosed subject matter may further include a user interface unit 550 (e.g., a display adapter, a haptic interface, a human interface device). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540) of the information processing system 500. In such an embodiment, the information processing system 500 may include one or more native applications, which may be installed locally (e.g., within the non-volatile memory 530) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
   a first power signal having a high voltage;
   a second power signal having a low voltage;
   a third power signal having a voltage configured to switch between the high voltage and the low voltage;
   a latching circuit powered by the first power signal and the second power signal; and
   a selection circuit configured to select between, at least, a first data signal and a second data signal, and powered by the first power signal, the second power signal, and the third power signal.

2. The apparatus of claim 1, wherein the selection circuit is configured to select the second data signal when the third power signal is at the low voltage.

3. The apparatus of claim 1, wherein the third power signal is coupled within the selection circuit so as to substantially turn off a portion of the selection circuit when the third power signal is at the high voltage.

4. The apparatus of claim 1, wherein the second data signal is a scan chain signal, and wherein the third power signal is a scan enable signal.

5. The apparatus of claim 1, wherein the third power signal is coupled to the selection circuit to act as a ground for at least a portion of the selection circuit.

6. The apparatus of claim 1, wherein the selection circuit comprises a first stage and a second stage; and
   wherein the first stage is powered by the first power signal and the second power signal; and
   wherein the second stage is powered by the third power signal, and with either the first power signal or the second power signal.

7. The apparatus of claim 6, wherein the first stage receives the first data signal as input, and the second stage receives the second data signal as input.

8. The apparatus of claim 1, wherein the selection circuit comprises a transistor, and wherein the third power signal is coupled directly with either a source terminal or a drain terminal of the transistor.

9. An apparatus comprising:
   a first stage of the apparatus, wherein the first stage is powered by a first power signal and a second power signal, and receives a first data signal as input, and outputs a selected data signal; and
   a second stage of the apparatus, wherein the second stage is powered by a third power signal, and either the first power signal or the second power signal, and receives a second data signal as input, and is coupled with the first stage, wherein the third power signal includes a scan enable signal; and wherein the apparatus is configured to output either the first data signal or the second data signal as the selected data signal based, at least in part, upon the scan enable signal.

10. The apparatus of claim 9, wherein the first stage comprises a set of transistors arranged substantially in series and coupled between the first power signal and the second power signal; and wherein the second stage comprises:
a first set of transistors coupled in series and coupled between the third power signal and the first stage.

11. The apparatus of claim 10, wherein the first set of transistors are configured to be substantially powered off when the third power signal is substantially at a predefined voltage.

12. The apparatus of claim 11, wherein the predefined voltage is substantially equal to a voltage of the second power signal.

13. The apparatus of claim 10, wherein the second stage comprises:
a second set of transistors coupled in series and coupled between the first stage, and either the first power signal or the second power signal; and
wherein the third power signal is coupled with a gate terminal of a transistor of the second set of transistors.

14. The apparatus of claim 10, wherein the third power signal is coupled with a gate terminal of a transistor of the set of transistors of the first stage.

15. The apparatus of claim 9, wherein the first power signal has a high voltage;
the second power signal has a low voltage;
the third power signal is configured to switch between the high voltage and the low voltage.

16. The apparatus of claim 9, wherein the first stage comprises a first transistor and the third power signal is coupled with a gate terminal of the first transistor;

wherein the second stage comprises a second transistor and the third power signal is coupled with a gate terminal of the second transistor; and wherein the second stage comprises a third transistor and the third power signal is coupled with either a drain terminal or a source terminal of the third transistor.

17. The apparatus of claim 9, wherein both the first stage and second stage of the apparatus are coupled with the first power signal as a high voltage rail;
the first stage is coupled with the second power signal as a ground rail; and
the second stage is coupled with the third power signal as a ground rail.

18. A scan chain flip-flop comprising:
a selection circuit configured to select between a data signal and a scan-in signal, based upon a scan enable signal, and output a selected data signal; and
a flip-flop circuit configured to latch the selected data signal; and
wherein the selection circuit is configured to be, at least partially, coupled with the scan enable signal as a power rail.

19. The scan chain flip-flop of claim 18, wherein the flip-flop circuit is coupled to a high voltage signal as a high power rail, and a low voltage signal as a first ground power rail; and
wherein the selection circuit:
is coupled with the high voltage signal as the high power rail,
a first stage of the selection circuit is coupled to the low voltage signal as the first ground power rail, and
a second stage of the selection signal is coupled to the scan enable signal as a second ground power rail.

20. The scan chain flip-flop of claim 18, wherein the selection circuit is coupled with the scan enable signal both as a power rail and as an input data signal.

* * * * *